(12) United States Patent
Tseng et al.

(10) Patent No.: US 11,984,353 B2
(45) Date of Patent: May 14, 2024

(54) HIGH CAPACITANCE MIM DEVICE WITH SELF ALIGNED SPACER

(71) Applicant: Taiwan Semiconductor Manufacturing Co., Ltd., Hsinchu (TW)

(72) Inventors: Hsuan-Han Tseng, Hsinchu (TW); Chun-Yuan Chen, Tainan (TW); Lu-Sheng Chou, Hsinchu (TW); Hsiao-Hui Tseng, Tainan (TW); Jhy-Jyi Sze, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 99 days.

(21) Appl. No.: 17/352,812

(22) Filed: Jun. 21, 2021

(65) Prior Publication Data
US 2022/0246469 A1     Aug. 4, 2022

Related U.S. Application Data

(60) Provisional application No. 63/145,879, filed on Feb. 4, 2021.

(51) Int. Cl.
*H01L 21/768* (2006.01)
*H01L 49/02* (2006.01)

(52) U.S. Cl.
CPC .. *H01L 21/76832* (2013.01); *H01L 21/76831* (2013.01); *H01L 28/88* (2013.01)

(58) Field of Classification Search
CPC ..... H01L 28/88; H01L 23/5223; H01L 28/40; H01L 28/60; H01L 28/56; H01L 28/75;
(Continued)

(56) References Cited

U.S. PATENT DOCUMENTS

| | | | |
|---|---|---|---|
| 2003/0178696 A1* | 9/2003 | Adler | H01L 28/55 257/532 |
| 2005/0023640 A1 | 2/2005 | Choi et al. | |

(Continued)

FOREIGN PATENT DOCUMENTS

| | | |
|---|---|---|
| DE | 102019118369 A1 | 7/2019 |
| KR | 20070069650 A | 7/2007 |
| KR | 20080111743 A | 12/2008 |

*Primary Examiner* — Thanhha S Pham
(74) *Attorney, Agent, or Firm* — Eschweiler & Potashnik, LLC

(57) ABSTRACT

The present disclosure, in some embodiments, relates to a method of forming a capacitor structure. The method includes forming a capacitor dielectric layer over a lower electrode layer, and forming an upper electrode layer over the capacitor dielectric layer. The upper electrode layer is etched to define an upper electrode and to expose a part of the capacitor dielectric layer. A spacer structure is formed over horizontally extending surfaces of the upper electrode layer and the capacitor dielectric layer and also along sidewalls of the upper electrode. The spacer structure is etched to remove the spacer structure from over the horizontally extending surfaces of the upper electrode layer and the capacitor dielectric layer and to define a spacer. The capacitor dielectric layer and the lower electrode layer are etched according to the spacer to define a capacitor dielectric and a lower electrode.

20 Claims, 15 Drawing Sheets

(58) Field of Classification Search
CPC ... H01L 28/86; H01L 28/90; H01L 21/76832; H01L 21/76831
See application file for complete search history.

(56) References Cited

U.S. PATENT DOCUMENTS

| | | |
|---|---|---|
| 2006/0024899 A1* | 2/2006 | Crenshaw ............... H01L 28/57 257/E21.019 |
| 2006/0160319 A1 | 7/2006 | Giraudin et al. |
| 2007/0267674 A1 | 11/2007 | Lin et al. |
| 2010/0181645 A1 | 7/2010 | Marenco |
| 2017/0207387 A1 | 7/2017 | Yang et al. |
| 2018/0366401 A1 | 12/2018 | Suo et al. |
| 2020/0105772 A1* | 4/2020 | Chen ....................... H01L 28/60 |

* cited by examiner

HIGH CAPACITANCE MIM DEVICE WITH SELF ALIGNED SPACER

REFERENCE TO RELATED APPLICATION

This application claims the benefit of U.S. Provisional Application No. 63/145,879, filed on Feb. 4, 2021, the contents of which are hereby incorporated by reference in their entirety.

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips also comprise passive devices, such as capacitors, resistors, inductors, varactors, etc. Passive devices are widely used to control integrated chip characteristics, such as gains, time constants, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
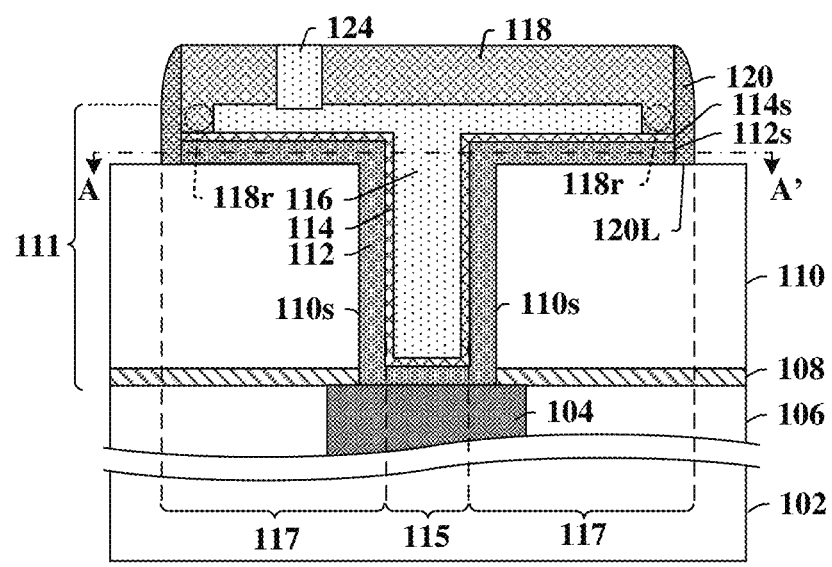
FIG. 1 illustrates a cross-sectional view of some embodiments of an integrated chip having a high density MIM (metal-insulator-metal) capacitor structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors typically comprise a capacitor dielectric arranged between an upper conductive electrode and a lower conductive electrode. The upper conductive electrode and the lower conductive electrode are often disposed within an inter-level dielectric (ILD) layer on a back-end-of-the-line (BEOL) of an integrated chip. Typically, a MIM capacitor is formed by depositing a capacitor dielectric layer over a lower electrode layer and subsequently depositing an upper electrode layer over the capacitor dielectric layer. The upper electrode layer, the capacitor dielectric layer, and the lower electrode layer are subsequently patterned to define a MIM capacitor having a capacitor dielectric disposed between an upper electrode and a lower electrode.

It has been appreciated that the edge of the MIM capacitor is a source of weakness, and thus prone to failure. One factor that helps improve the strength/reliability at the edge is to have the lower electrode and capacitor dielectric have one footprint, and the top electrode to have a smaller footprint than the lower electrode, such that an outer sidewall of the upper electrode is recessed relative to an outer sidewall of the lower electrode. This allows for a capping structure to be formed on the capacitor dielectric to surround the upper electrode, and helps limit risk of the upper electrode shorting to the lower electrode due to conductive residue forming along sidewalls of the capacitor dielectric and upper electrode when the lower electrode is etched during processing. However, this also potentially leaves an outer sidewall of the lower electrode and capacitor dielectric exposed during processing, and these outer sidewalls are potentially susceptible to moisture and/or plasma damage. Thus, some aspects of the present disclosure provide a spacer surrounding an outer sidewall of the MIM capacitor to protect the MIM capacitor from moisture and/or plasma damage. The material of the spacer is selected to be effective at isolating moisture, and can for example, be made of silicon nitride.

FIG. 1 illustrates a cross-sectional view of some embodiments of an integrated chip 100 having a high density MIM (metal-insulator-metal) capacitor structure.

The integrated chip 100 comprises one or more lower interconnects 104 disposed within a lower dielectric structure 106 over a substrate 102. A first etch stop layer 108 is disposed over the lower dielectric structure 106 and a first dielectric layer 110 is disposed over the first etch stop layer 108. The first dielectric layer 110 comprises one or more inner sidewalls 110s that define at least one opening extending through the first dielectric layer 110.

A MIM capacitor structure 111 is arranged over the first dielectric layer 110 and extends through the opening to electrically contact the one or more lower interconnects 104. The MIM capacitor structure 111 comprises a capacitor dielectric 114 disposed vertically between a lower electrode 112 and an upper electrode 116. In some embodiments, the capacitor dielectric 114 may be disposed both vertically and laterally between the lower electrode 112 and the upper electrode 116. In some embodiments, the lower electrode 112 is arranged along an upper surface and the one or more inner sidewalls 110s of the first dielectric layer 110, the capacitor dielectric 114 is arranged along an upper surface and one or more inner sidewalls of the lower electrode 112, and the upper electrode 116 is arranged along an upper surface and one or more inner sidewalls of the capacitor dielectric 114. In some embodiments, a capping structure 118 that comprises dielectric material is arranged over the upper electrode 116. In some embodiments, an interconnect via 124 extends through the capping structure 118 to contact the upper electrode 116.

A spacer 120 is arranged along opposing outermost sidewalls of the lower electrode 112, capacitor dielectric 114, and capping structure 118. The spacer 120 has a lowermost surface 120L that is disposed on an upper surface of the first dielectric layer 110. In some embodiments, the lowermost surface 120L of the spacer 120 directly contacts the upper surface of the first dielectric layer 110. In some additional embodiments, the lowermost surface 120L of the spacer 120 is completely confined over the upper surface of the first dielectric layer 110.

The material of the spacer 120 is selected to be effective at isolating moisture, and can for example, be made of silicon nitride. Thus, the spacer 120 surrounds outer sidewalls 112s of the lower electrode 112 and outer sidewalls 114s of the capacitor dielectric 114, and protects these outer sidewalls from moisture and/or plasma damage. In some cases, the innermost sidewall of the spacer 120 is spaced apart from an outer sidewall of the upper electrode 116, such that the capping structure 118 has a protrusion or lower ring 118r separating the inner most sidewall of the spacer 120 and the outer sidewall of the upper electrode 116. This allows the capping structure 118 to reduce the likelihood that etch reside arising when the lower electrode 112 is etched will short the lower electrode 112 to the upper electrode 116. Thus, the configuration of FIG. 1 promotes high yield and reliability for integrated chip.

Figure 2A:
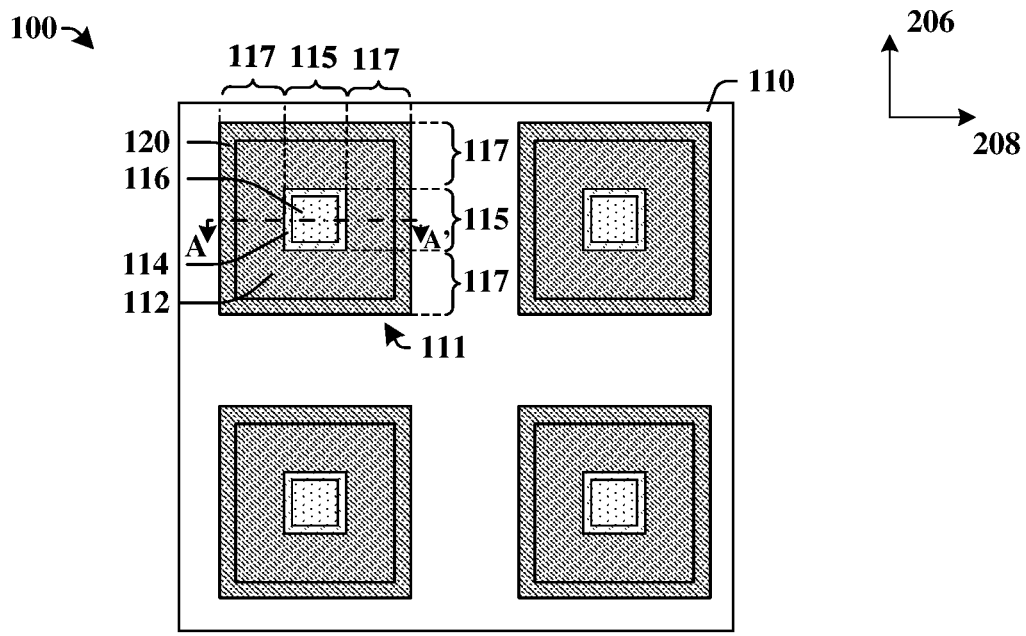
FIGS. 2A-2B illustrate top views of some embodiments of an integrated chip having a high density MIM capacitor structure consistent with FIG. 1's cross-sectional view.
Figure 2B:
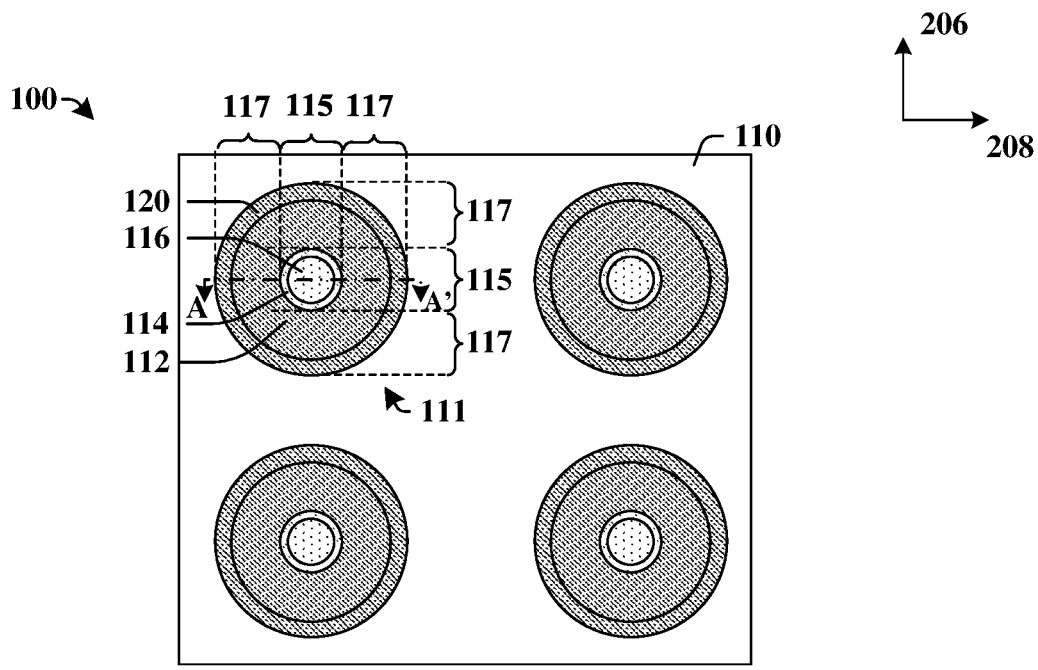

FIGS. 2A and 2B illustrate various top-views consistent with the integrated chip of FIG. 1, taken along cross-sectional line A-A' of FIG. 1, and are now described concurrently with FIG. 1.

Referring now to top-view of FIG. 2A and cross-sectional view of FIG. 1, each MIM capacitor structure 111 can have a substantially square or rectangular shape that extends a first distance along a first direction 206 and that extends a second distance along a second direction 208, which is perpendicular to the first direction 206. The second distance can be greater than or equal to the first distance. Thus, the outer edges/sidewalls of the lower electrode 112, capacitor dielectric layer 114, and upper electrode 116, as well as inner sidewalls of the lower electrode 112 and capacitor dielectric layer 114 are substantially square or rectangular as viewed from above. The lower electrode 112, capacitor dielectric layer 114, and upper electrode 116 can each include a central region 115 and peripheral region 117. Protrusions are disposed in central regions 115 of the lower electrode 112, capacitor dielectric layer 114, and upper electrode 116 and are generally concentric with regards to one another. Lateral regions of the lower electrode 112, capacitor dielectric layer 114, and upper electrode 116 are arranged in the peripheral regions 117 that extend horizontally over the upper surface of the first dielectric layer 110. Further, in some embodiments, the MIM capacitor structures 111 may be arranged in an array. In some such embodiments, the MIM 111 capacitors may be aligned in rows (extending in the first direction 206) and columns (extending in the second direction 208), and the MIM capacitor structures 111 of the array may be coupled together to be electrically in parallel or can be used as individual capacitors.

The peripheral region 117 of each lower electrode 112 extends generally horizontally over an upper surface of the first dielectric layer 110, and has a central region 115 that extends vertically along inner sidewalls of the first dielectric layer 110. The capacitor dielectric layer 114 has a peripheral region 117 that extends generally horizontally over an upper surface of the lower electrode 112, and has a central region 115 that extends vertically along inner sidewalls of the lower electrode 112, and separates the lower electrode 112 from the upper electrode 116. The upper electrode 116 has a peripheral region 117 that extends generally horizontally over an upper surface of the capacitor dielectric layer 114, and has a central region 115 that extends vertically along inner sidewalls of the capacitor dielectric layer 114. The lower electrode 112 and the capacitor dielectric layer 114 have outer edges/sidewalls that are aligned and that contact an inner sidewall of the spacer 120. Thus, the lower electrode 112 and capacitor dielectric layer 114 have the same length and same width, while the upper electrode 116 has a second width and/or length that is less than that of the lower electrode 112 and capacitor dielectric layer 114. The spacer 120 extends around a perimeter of the lower electrode 112 and capacitor dielectric layer 114 in a closed path. The lower electrode 112 and the capacitor dielectric layer 114 have outermost perimeters that are substantially the same as an innermost perimeter of the spacer 120.

As shown in top-view of FIG. 2B, in other embodiments, each MIM capacitor structure 111 can have a substantially circular shape as viewed from above. Thus, the outer edges/sidewalls of the lower electrode 112, capacitor dielectric 114, and upper electrode 116, as well as inner sidewalls of the lower electrode 112 and capacitor dielectric layer 114 are substantially circular as viewed from above. In other embodiments, MIM capacitors can have an oval shape as viewed from above, or can have a square or rectangular shape with rounded corners, more complicated polygonal shapes with interdigitated fingers, or winding paths, among other shapes.

Figure 3A:
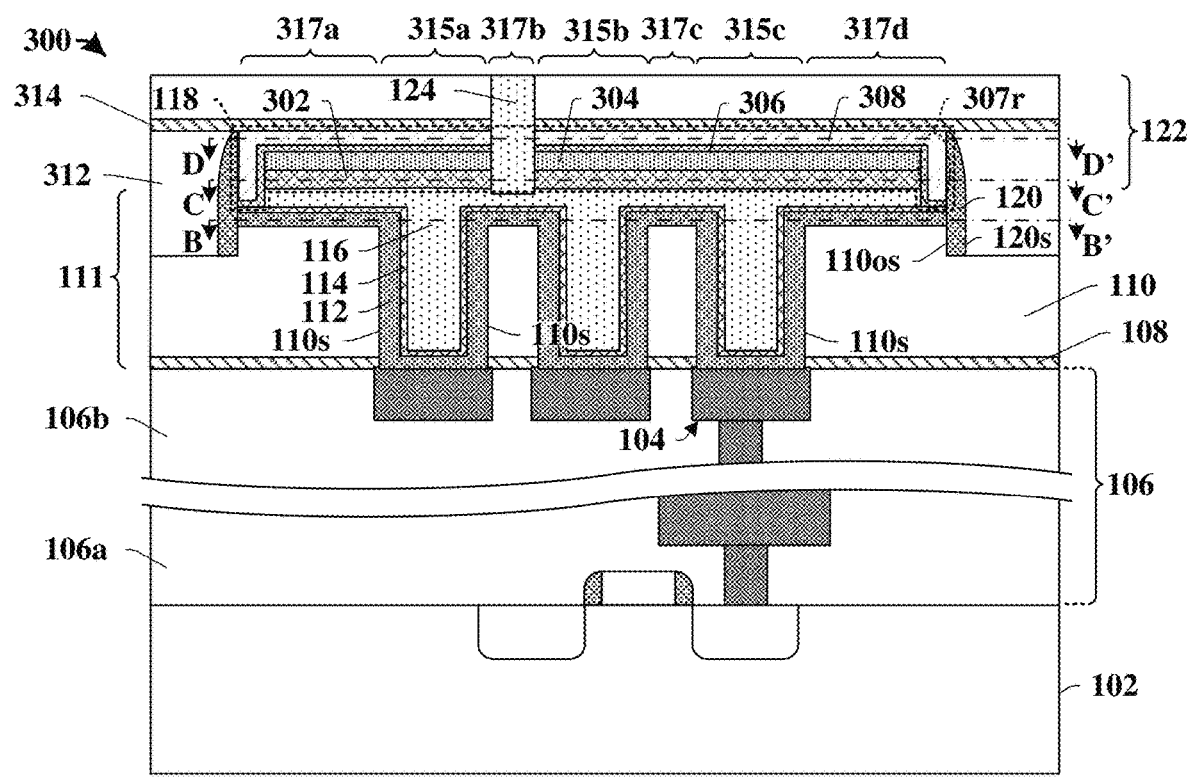
FIG. 3A illustrates a cross-sectional view of some embodiments of an integrated chip having a high density MIM capacitor structure.
Figure 3B:
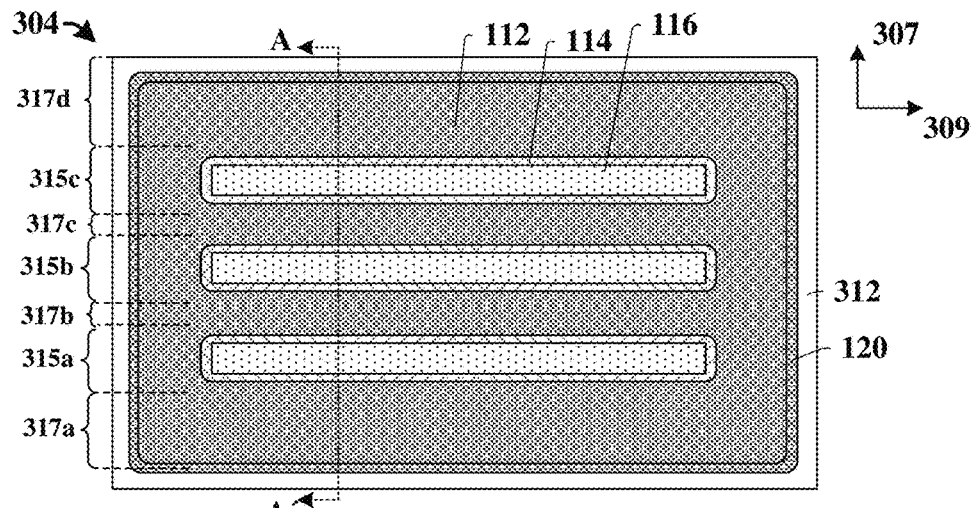
FIGS. 3B-3D illustrate various sectional top views of some embodiments of an integrated chip having a high density MIM capacitor structure consistent with FIG. 3A's cross-sectional view.
Figure 3C:
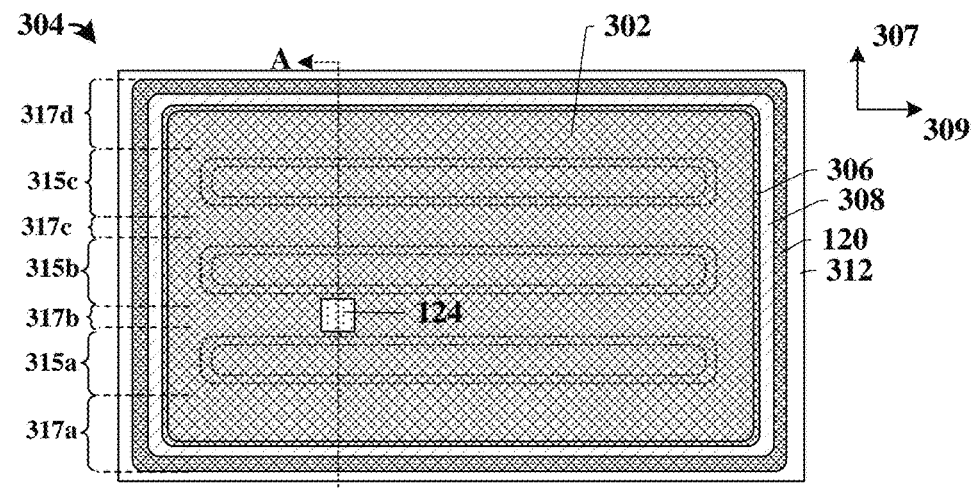
Figure 3D:
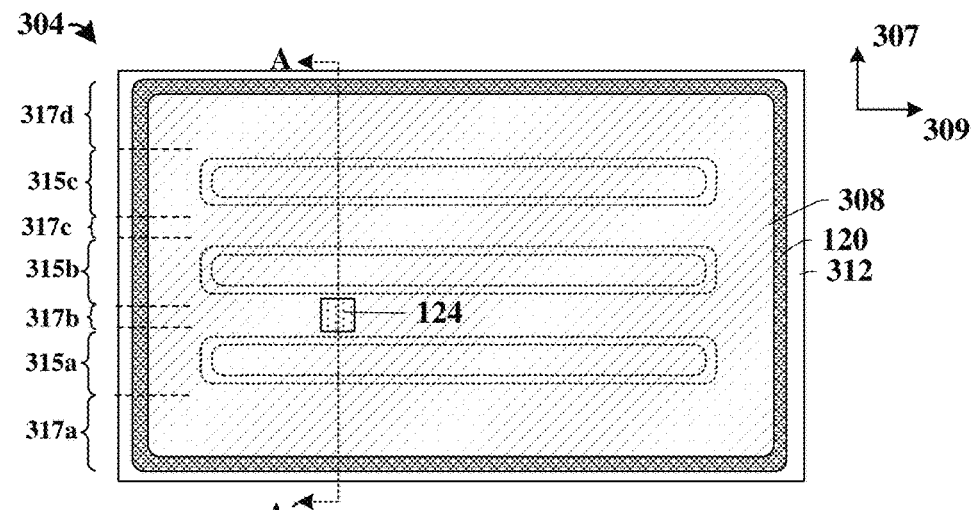

FIG. 3A illustrates a cross-sectional view of an integrated chip 300 having a high density MIM capacitor structure, and FIGS. 3B, 3C, and 3D show various sectional top-views, respectively, consistent with the cross-sectional view of FIG. 3A. The top view of FIG. 3B is taken along cross-sectional line B-B' of the cross-sectional view of FIG. 3A, the top view of FIG. 3C is taken along cross-sectional line C-C' of the cross-sectional view of FIG. 3A; and the top view of FIG. 3D is taken along cross-sectional line D-D' of the cross-sectional view of FIG. 3A. FIGS. 3A-3D are now described concurrently below.

The integrated chip 300 comprises one or more lower interconnects 104 disposed within a lower dielectric structure 106 over a substrate 102. The lower dielectric structure 106 comprises a plurality of stacked inter-level dielectric (ILD) layers 106a-106b disposed over the substrate 102. In some embodiments, the plurality of stacked ILD layers 106a-106b may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), un-doped silicate glass (USG), a porous dielectric material, or the like. In some embodiments, the one or more lower interconnects 104 may comprise one or more of a middle-of-line (MOL) interconnect, a conductive contact, an interconnect wire, an interconnect via, or the like. In some embodiments, the one or more lower interconnects 104 may comprise one or more of copper, tungsten, ruthenium, aluminum, and/or the like.

A first etch stop layer 108 is disposed over the lower dielectric structure 106 and a first dielectric layer 110 is disposed over the first etch stop layer 108. A MIM capacitor structure 111 is arranged over the first dielectric layer 110 and extends through the first dielectric layer 110 and the first etch stop layer 108 to electrically contact the one or more lower interconnects 104. The MIM capacitor structure 111 comprises a lower electrode 112 arranged along an upper surface and one or more sidewalls of the first dielectric layer 110, a capacitor dielectric 114 arranged along an upper surface and one or more sidewalls of the lower electrode 112, and an upper electrode 116 arranged an upper surface and one or more sidewalls of the capacitor dielectric 114.

In some embodiments, the lower electrode 112 and the upper electrode 116 may respectively comprise a metal such as aluminum, copper, tantalum, titanium, tantalum nitride, titanium nitride, tungsten, and/or the like. In some embodiments, the lower electrode 112 comprises the same metal as the upper electrode 116, while in other embodiments the lower electrode 112 and the upper electrode 116 may comprise different metals. The lower electrode 112 and the upper electrode 116 respectively have a thickness that is in a range of between approximately 10 Angstroms (Å) and approximately 200 Å, between approximately 50 Å and approximately 100 Å, or other similar values. In some embodiments, the capacitor dielectric 114 may comprise a high-k dielectric material. In some embodiments, the capacitor dielectric 114 may comprise one or more of aluminum oxide ($Al_2O_3$), hafnium oxide ($HfO_2$), silicon dioxide ($SiO_2$), silicon carbide (SiC), silicon mononitride (SiN), silicon nitride ($Si_3N_4$), tantalum nitride ($Ta_2O_5$), tantalum oxynitride (TaON), titanium oxide ($TiO_2$), zirconium oxide ($ZrO_2$), or the like. The capacitor dielectric 114 may also include an ONO layer comprising: a lower oxide (O) layer, a nitride (N) layer stacked over the lower oxide layer, and an upper oxide (O) layer stacked over the nitride layer and separated from the lower nitride layer by the nitride layer.

A capping structure 118 is arranged over the upper electrode 116. In some embodiments, the capping structure 118 may comprise a first protecting layer 302, an anti-reflecting layer 304 over the first protecting layer 302, a second protecting layer 306 over the anti-reflecting layer 304, and a first upper etch stop layer 308 over the second protecting layer 306. In some embodiments, the second protecting layer 306 and the first upper etch stop layer 308 include an upper lateral region and a rim 307r that extends downwardly from an outer edge of the upper lateral region to contact an upper surface of the capacitor dielectric 114. The first protecting layer 302 prevents the top surface of the upper electrode 116 from being exposed during processing, and can for example, include silicon dioxide, silicon nitride, or an oxide-nitride-oxide (ONO) layer. The anti-reflecting layer 304 can for example, comprise a carbide or nitride, such as silicon carbide or silicon oxynitride. The second protecting layer 306 comprises silicon dioxide or a high-k dielectric. The first upper etch stop layer 308 can comprise a dielectric such as silicon nitride, silicon carbide, or the like.

A spacer 120 is arranged along opposing sides of the upper electrode 116 and the capping structure 118. The spacer 120 has an outermost surface 120s that continuously extends between a lowermost surface of the spacer 120 and a top and/or a topmost surface of the spacer 120. In some embodiments, the outermost surface 120s of the spacer 120 may comprise a curved surface. For example, the outermost surface 120s of the spacer 120 may comprise a vertically extending segment and a curved segment over the vertically extending segment. In such embodiments, an inner sidewall of the vertically extending segment is substantially aligned with outermost sidewalls of the capacitor dielectric 114 and the lower electrode 112. In some embodiments, the first dielectric layer 110 may comprise an outer sidewall 110os that is substantially aligned with an inner sidewall of the vertically extending segment of the spacer 120.

In some embodiments, the spacer 120 may comprise an oxide (e.g., silicon dioxide, silicon rich oxide, or the like), a nitride (e.g., silicon nitride), a carbide (e.g., silicon carbide), or the like.

A second dielectric layer 312 is arranged over the MIM capacitor structure 111 and the first dielectric layer 110. In some embodiments, the second dielectric layer 312 is arranged along an upper surface and the outer sidewall 110os of the first dielectric layer 110. In some embodiments, the second dielectric layer 312 may comprise one or more of silicon dioxide, silicon nitride, carbon doped silicon dioxide, silicon oxynitride, BSG, PSG, BPSG, FSG, USG, a porous dielectric material, or the like. A second etch stop layer 314 is disposed over the second dielectric layer 312.

MIM capacitor structure 111 comprises a plurality of protrusions 315a-315c that extend downward from a lateral region 317a-317d of the MIM capacitor structure 111. The plurality of protrusions 315a-315c respectively comprise a lower electrode 112, a capacitor dielectric 114, and an upper electrode 116.

By having a plurality of protrusions 315a-315c extending outward from the lateral region of the MIM capacitor structure 111, a capacitance of the MIM capacitor structure 111 can be further increased. For example, a MIM capacitor structure 111 with three protrusions may have a capacitance that is between approximately 50% and approximately 70% greater than a capacitor with 2 protrusions. In some embodiments, the plurality of protrusions 315a-315c may comprise three protrusions or four protrusions.

FIG. 3B illustrates a top-view of the integrated chip of FIG. 3A, as taken along line B-B' in FIG. 3A. The cross-sectional view of FIG. 3A is taken along cross-sectional line A-A' of top-view of FIG. 3B.

As shown in top-view 304, the plurality of protrusions 315a-315c of the MIM capacitor structure 111 respectively have a substantially rectangular shape that extends a first distance along a first direction 307 and that extends a second distance along a second direction 309, which is perpendicular to the first direction 307. The second distance is greater than the first distance.

Within each of the plurality of protrusions 315a-315c, the lower electrode 112 completely surrounds the capacitor dielectric 114, and the upper electrode 116 completely surrounds the capacitor dielectric 114. The upper electrode 116 continuously extends past the plurality of protrusions 315a-315c along a first direction 307 and along a second direction 309 that is perpendicular to the first direction 307. The spacer 120 extends around a perimeter of the lower electrode 112 in a closed path. The lower electrode 112 and the capacitor dielectric 114 have outermost perimeters that are substantially the same as an outermost perimeter of the spacer 120.

FIG. 3C illustrates a top-view of the integrated chip of FIG. 3A, as taken along line C-C' in FIG. 3A. The cross-sectional view of FIG. 3A is taken along cross-sectional line A-A' of top-view of FIG. 3C. As shown in FIG. 3C, the first protecting layer 302 extends continuously over the plurality of protrusions 315a-315c, and the second protecting layer 306 and the first upper etch stop layer 308 have outer rim portions that laterally surround the first protecting layer 302. Spacer 120 laterally surrounds the outer rim portion of the first upper etch stop layer 308.

FIG. 3D illustrates a top-view of the integrated chip of FIG. 3A, as taken along line D-D' in FIG. 3A. The cross-sectional view of FIG. 3A is taken along cross-sectional line A-A' of top-view of FIG. 3D. As shown in FIG. 3D, the first upper etch stop layer 308 extends continuously over the plurality of protrusions 315a-315c, and has an outer perimeter that is surrounded by the spacer 120.

Figure 4:
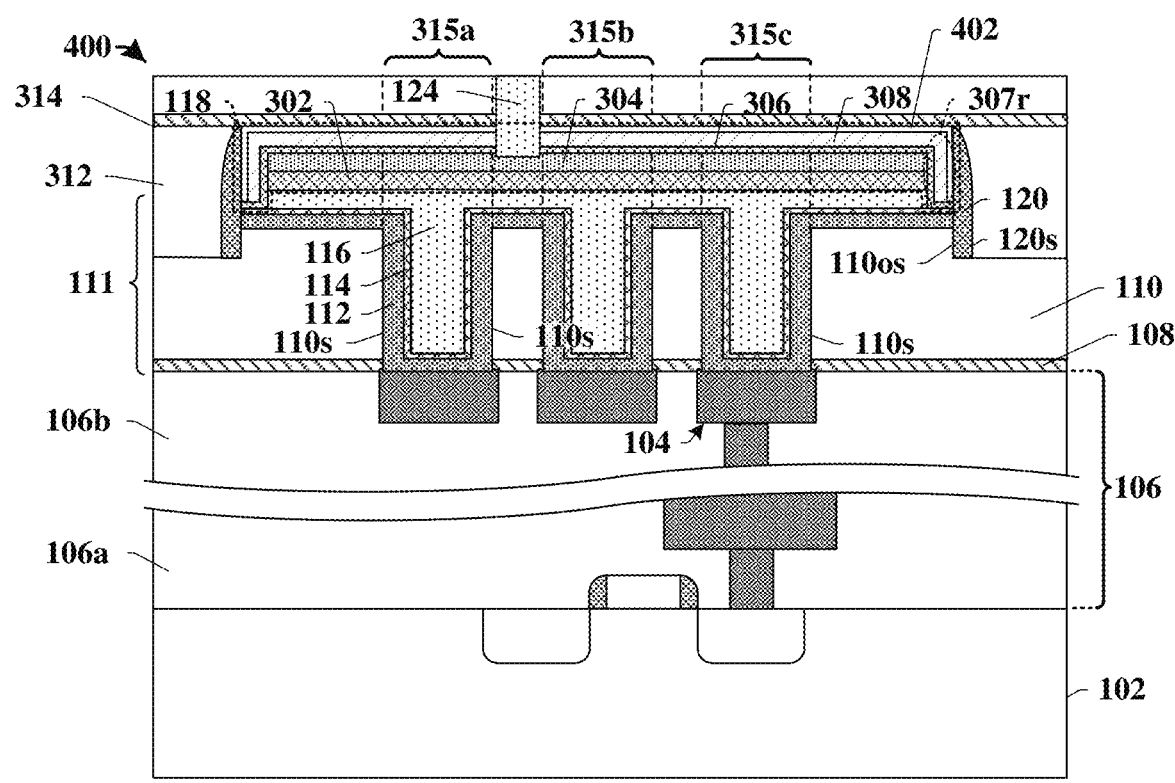
FIG. 4 illustrates a cross-sectional view of some additional embodiments of an integrated chip having a high density MIM capacitor structure.

FIG. 4 illustrates a cross-sectional view of some additional embodiments of an integrated chip 400 having a high density MIM capacitor structure. Compared to the example of FIG. 3A, FIG. 4's embodiment has a largely similar structure but also includes an additional upper protective layer 402 as part of the capping structure 118. In some embodiments, the additional upper protective layer 402 is a dielectric material comprising silicon dioxide, but could also comprise a nitride or another oxide, such as silicon nitride, silicon oxynitride, among others. The additional upper protective layer 402 may provide additional etch protection/selectivity during processing, while FIG. 3's embodiment is more streamlined and thus both provide advantages.

Figure 5:
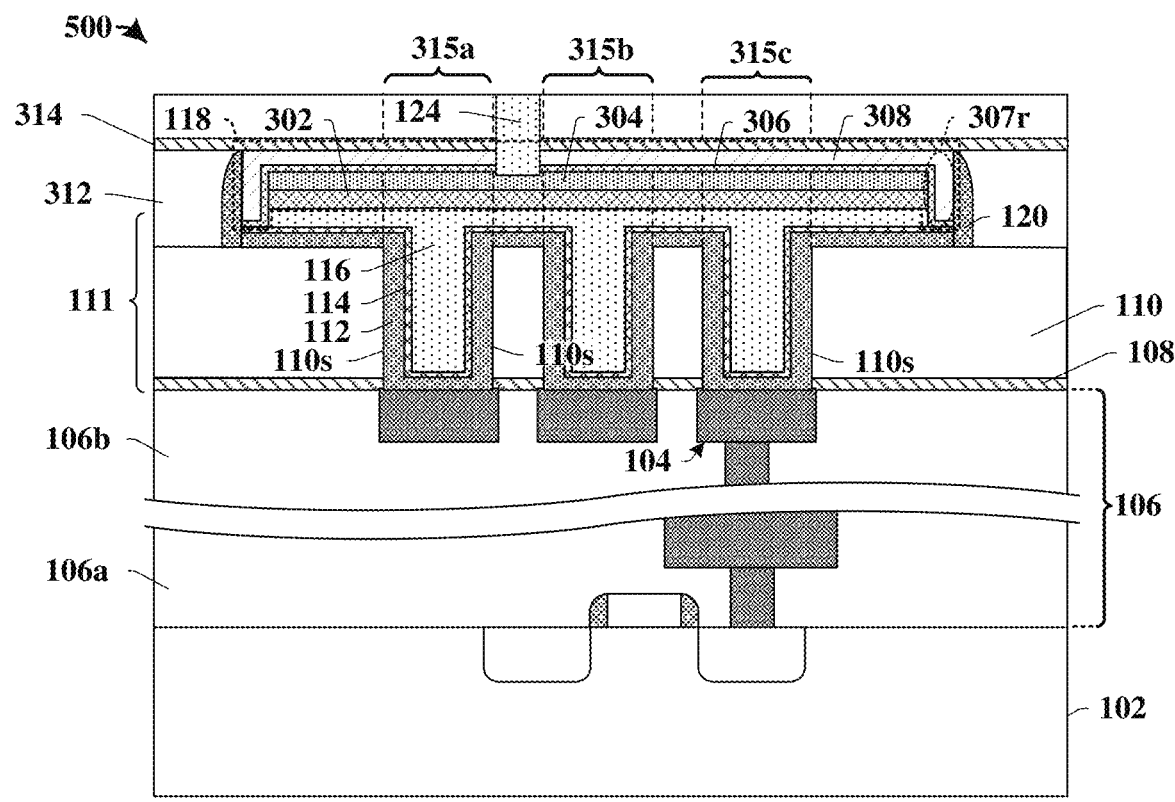
FIG. 5 illustrates a cross-sectional view of some additional embodiments of an integrated chip having a high density MIM capacitor structure.

FIG. 5 illustrates a cross-sectional view of some additional embodiments of an integrated chip 500 having a high density MIM capacitor structure. Compared to the example of FIG. 3A, FIG. 5's embodiment has a largely similar structure, however the spacer 120 in FIG. 5 has a lower surface that is planar or level with the lower surface of the lower electrode 112, whereas the spacer 120 in FIG. 3 has a lower surface that was below the lower surface of the lower electrode 112.

Figure 6:
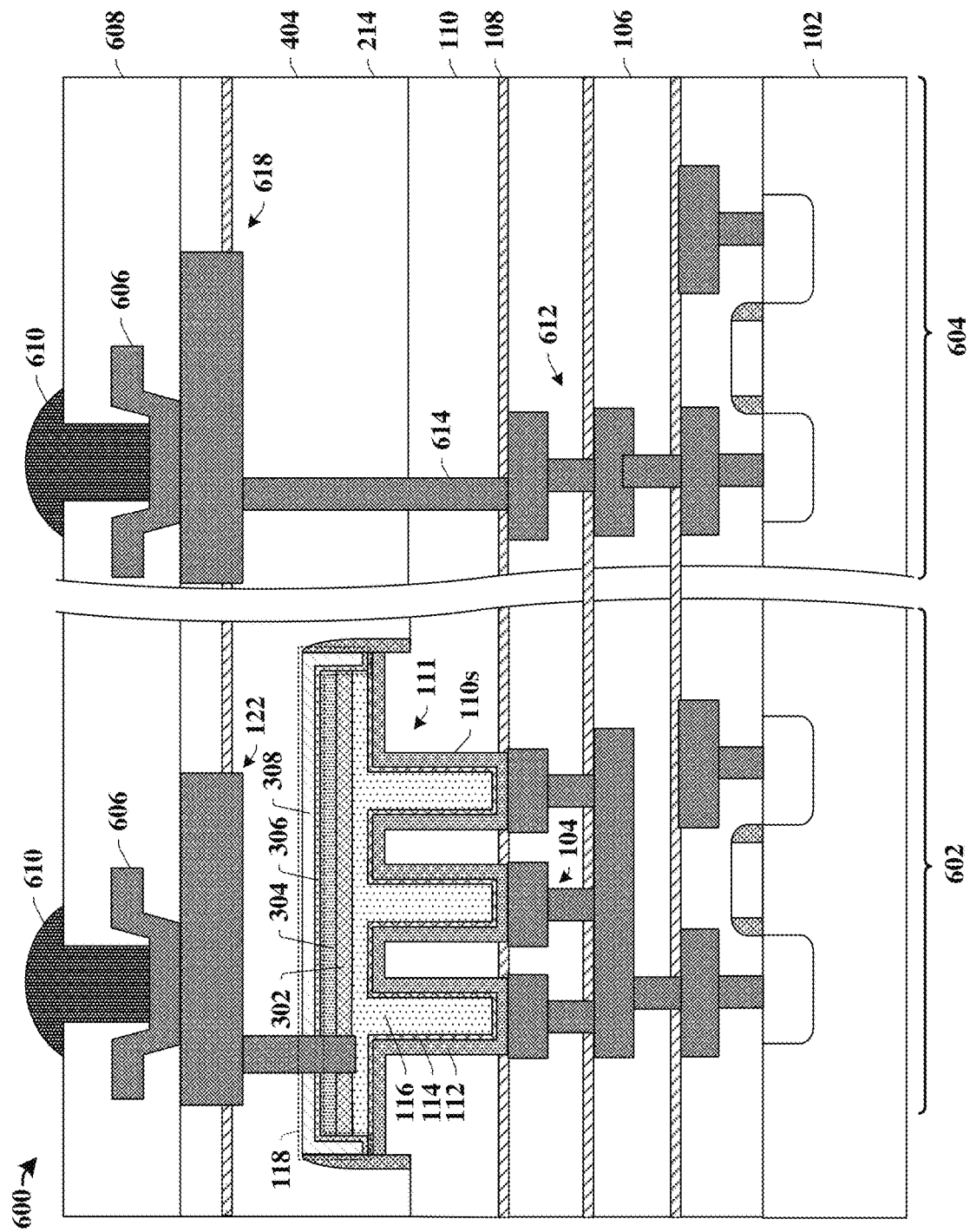
FIG. 6 illustrates a cross-sectional view of some additional embodiments of an integrated chip having a high density MIM capacitor structure.

FIG. 6 illustrates a cross-sectional view of some embodiments of an integrated chip 600 having a high density MIM capacitor structure.

The integrated chip 600 comprises a first region 602—which may also be referred to as a memory region—and a second region 604 which is laterally offset from the first region 602 and may be referred to as a logic region. Within the first region 602, one or more lower interconnects 104 are arranged within a lower dielectric structure 106 over a substrate 102. A MIM capacitor structure 111 is arranged over both a first etch stop layer 108 and a first dielectric layer 110 that are over the lower dielectric structure 106. The MIM capacitor structure 111 includes a lower electrode 112 and upper electrode 116 separated from one another by a capacitor dielectric 114. The lower electrode 112, upper electrode 116, and capacitor dielectric 114 each comprises one or more protrusions that extend through the first dielectric layer 110 to contact the one or more lower interconnects 104. A second dielectric layer 214 is arranged along sidewalls of the first dielectric layer 110 and over upper surface of the first dielectric layer 110 and the first etch stop layer 108. An upper interconnect structure 122 is arranged within an upper dielectric structure 402 that is over the first dielectric layer 110 and the second dielectric layer 214. The upper interconnect structure 122 is electrically coupled to the MIM capacitor structure 111.

Within the second region 604, one or more additional lower interconnects 612 are disposed within the lower dielectric structure 106. The one or more additional lower interconnects 612 are coupled to an additional interconnect via 614 passing through the first dielectric layer 110 and the second dielectric layer 214. An additional upper interconnect structure 618 is disposed within the upper dielectric structure 404.

In some embodiments, the upper interconnect structure 122 and the additional upper interconnect structure 618 may be disposed within a topmost inter-level dielectric (ILD) layer 608 and/or a topmost interconnect layer. In such embodiments, the upper interconnect structure 122 and/or the additional upper interconnect structure 618 are connected to an overlying bond pad 606 that is further coupled to an external bonding structure 610 (e.g., a solder bump, a micro-bump, or the like). Placement of the MIM capacitor structure 111 onto an interconnect layer immediately underlying the topmost ILD layer and/or the topmost interconnect layer provides the MIM capacitor structure 111 with a relatively large height (e.g., since a height of an ILD layer and/or interconnect layer generally increases as a distance from the substrate 102 increases). The relatively large height of the MIM capacitor structure 111 further increases a capacitance of the MIM capacitor structure 111 without increasing a footprint of the MIM capacitor structure 111.

FIGS. 7-19 illustrate cross-sectional views of some embodiments of a method of forming an integrated chip having a high density MIM capacitor structure. Although FIGS. 7-19 are described in relation to a method, it will be appreciated that the structures disclosed in FIGS. 7-19 are not limited to such a method, but instead may stand alone as structures independent of the method.

Figure 7:
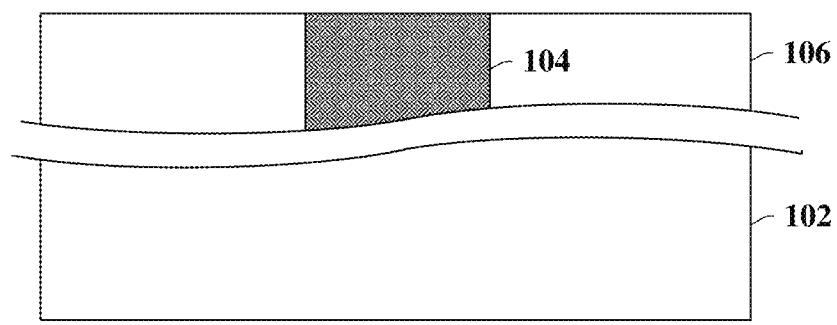
FIGS. 7-19 illustrate cross-sectional views of some embodiments of a method of forming an integrated chip having a high density MIM capacitor structure.

As shown in cross-sectional view 700 of FIG. 7, one or more lower interconnects 104 are formed within a lower dielectric structure 106 formed over a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the one or more lower interconnects 104 may comprise one or more of a middle-of-line (MOL) interconnect, a conductive contact, an interconnect wire, and/or an interconnect via.

In some embodiments, the one or more lower interconnects 104 may be respectively formed using a damascene process (e.g., a single damascene process or a dual damascene process). In such embodiments, the one or more lower interconnects 104 may be respectively formed by forming an inter-level dielectric (ILD) layer over the substrate 102, selectively etching the ILD layer to define a via hole and/or a trench within the ILD layer, forming a conductive material (e.g., copper, aluminum, etc.) within the via hole and/or the trench, and performing a planarization process (e.g., a chemical mechanical planarization (CMP) process) to remove excess of the conductive material from over the ILD layer.

Figure 8:
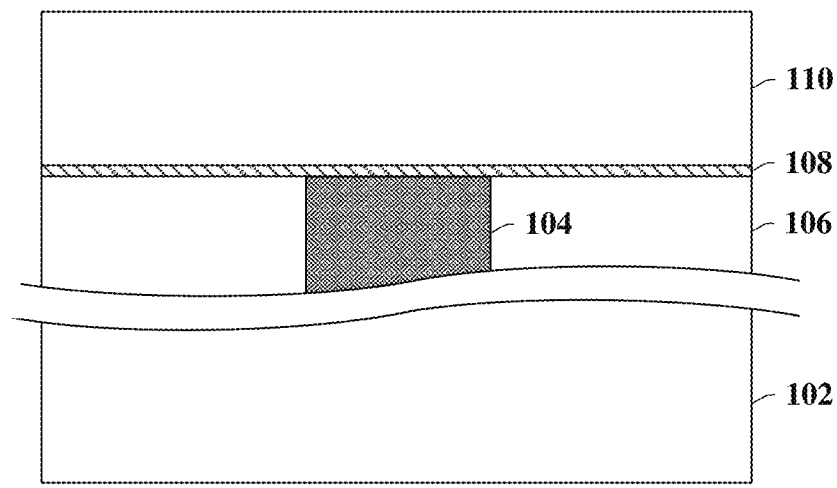

As shown in cross-sectional view 800 of FIG. 8, a first etch stop layer 108 is formed over the lower dielectric structure 106 and a first dielectric layer 110 is formed over the first etch stop layer 108. In some embodiments, the first etch stop layer 108 may comprise a nitride (e.g., silicon nitride), a carbide (e.g., silicon carbide), or the like. In some embodiments, the first dielectric layer 110 may comprise an oxide, a low-k dielectric material, or the like. In various embodiments, the first etch stop layer 108 and/or the first dielectric layer 110 may be formed by one or more deposition processes (e.g., a physical vapor deposition (PVD) process, a chemical vapor deposition (CVD) process, a plasma enhanced CVD (PE-CVD) process, an atomic layer deposition (ALD) process, or the like).

Figure 9A:
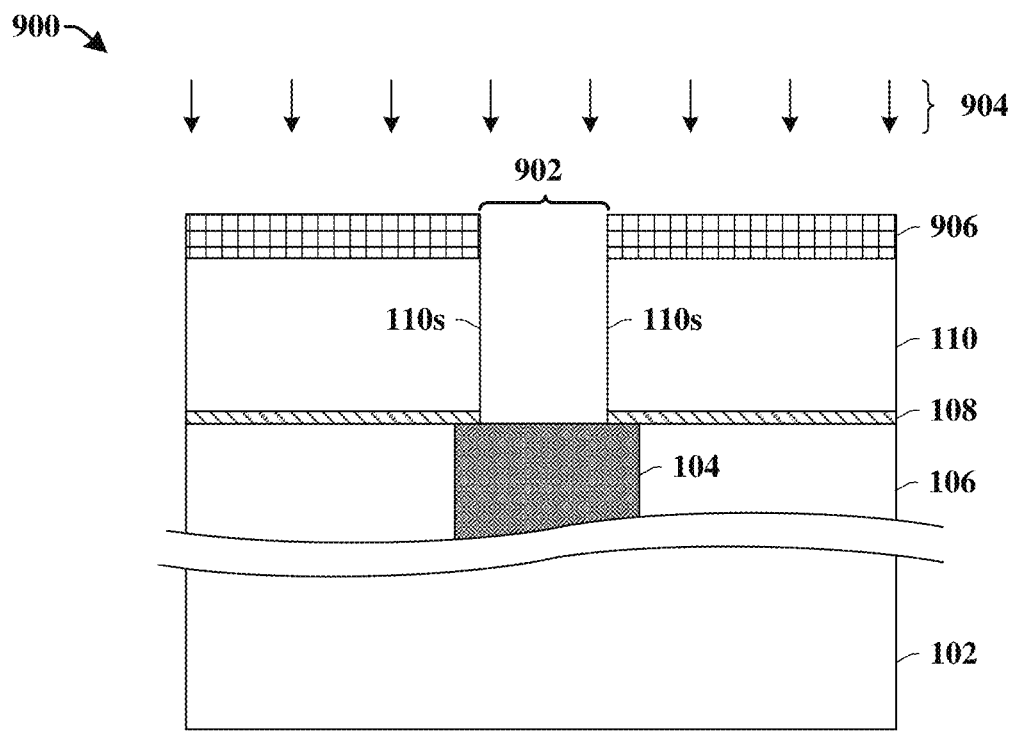
Figure 9B:
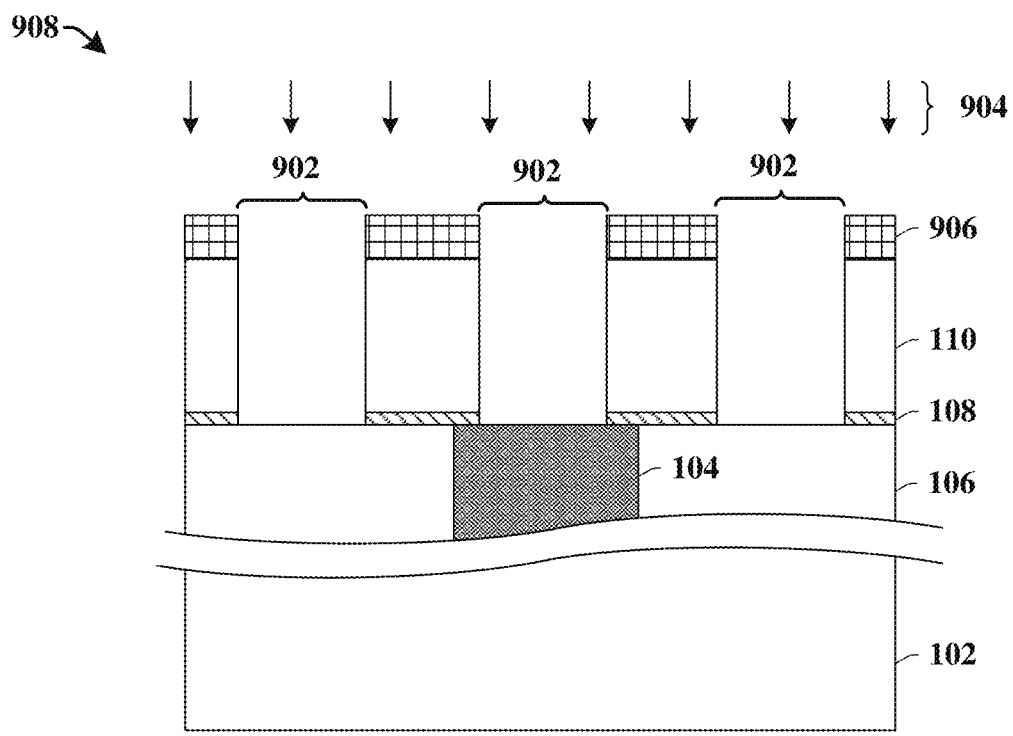

As shown in cross-sectional view 900 of FIG. 9A (taken along a first direction) and cross-sectional view 908 of FIG. 9B (taken along a second direction that is perpendicular to the first direction), a first etching process 904 is performed to pattern the first dielectric layer 110. The first etching process 904 forms one or more inner sidewalls 110s of the first dielectric layer 110 that define a plurality of openings 902 extending through the first dielectric layer 110. In some embodiments, the plurality of openings 902 may respectively have a substantially rectangular shape as viewed from a top-view. In other embodiments, the plurality of openings 902 may respectively have a substantially circular shape, a substantially square shape, or the like, as viewed from a top-view. In some embodiments, the first etching process 904 may be performed by exposing the first dielectric layer 110 to a first etchant according to a first mask 906. In some embodiments, the first etchant may comprise a plasma etchant having an etching chemistry comprising one or more of fluorine (F), tetrafluoromethane ($CF_4$), ozone ($O_2$), or $C_4F_8$ (Octafluorocyclobutane), or the like. In some embodiments, the first mask 906 may comprise a photosensitive material (e.g., photoresist), a hard mask, or the like.

Figure 10:
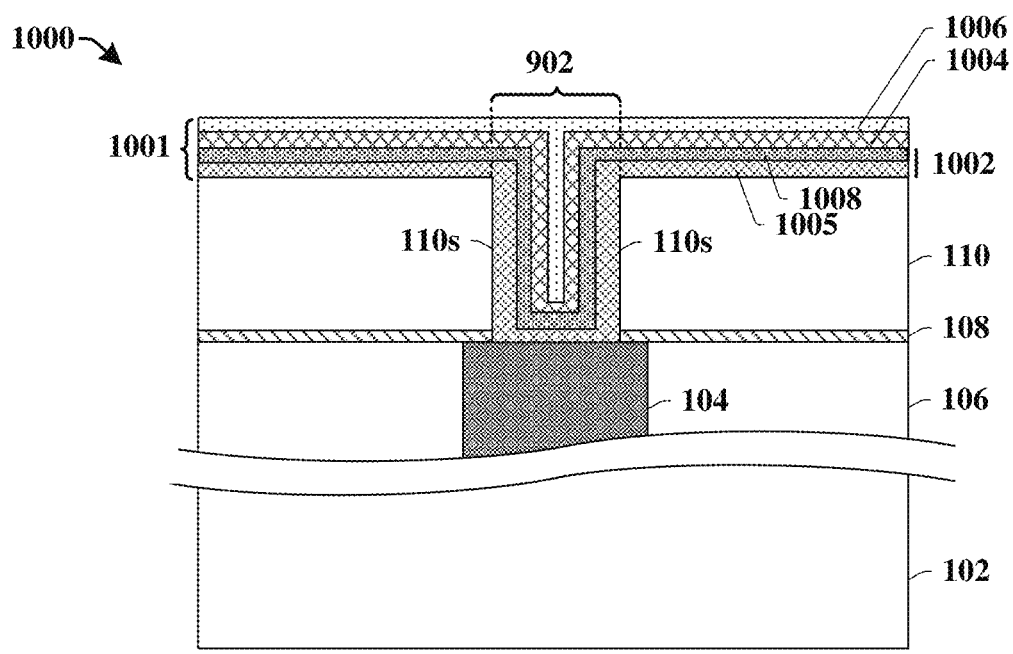

As shown in cross-sectional view 1000 of FIG. 10, a capacitor stack 1001 is formed over the first dielectric layer 110 and within the plurality of openings 902. In some embodiments, the capacitor stack 1001 may be formed by forming a lower electrode layer 1002 along the one or more inner sidewalls 110s and an upper surface of the first dielectric layer 110, by forming a capacitor dielectric layer 1004 along inner sidewalls and an upper surface of the lower electrode layer 1002, and by forming an upper electrode layer 1006 along inner sidewalls and an upper surface of the capacitor dielectric layer 1004. In some embodiments, the lower electrode layer 1002, the capacitor dielectric layer 1004, and the upper electrode layer 1006 may be formed by a plurality of deposition processes (e.g., a PVD process, a CVD process, a PE-CVD process, an ALD process, or the like). Further, the lower electrode layer 1002 can include a barrier layer 1005 comprising tantalum and/or titanium, for example, and an electrode layer 1008 formed over the barrier layer 1005. The electrode layer 1008 can comprise aluminum, copper, tantalum, titanium, tantalum nitride, titanium nitride, or tungsten, for example.

Figure 11:
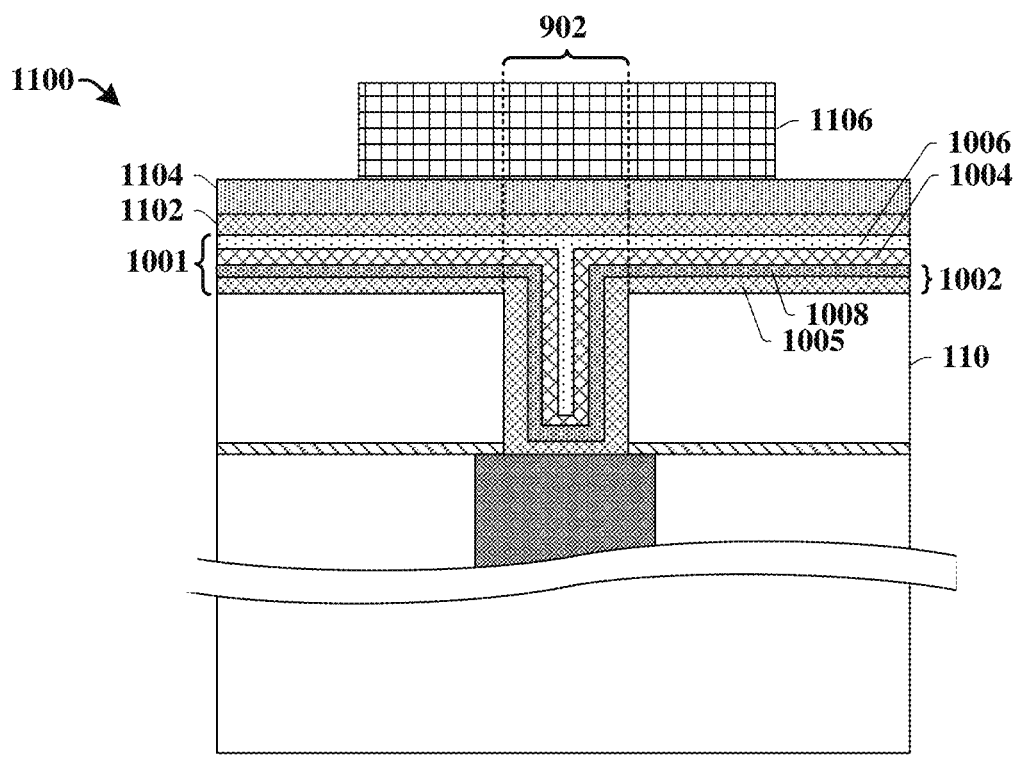

As shown in cross-sectional view 1100 of FIG. 11, one or more lower capping layers are formed over the capacitor stack 1001. In some embodiments, the one or more capping layers include an anti-reflective layer 1104 is formed over one or more protective layers 1102. A second mask 1106 is subsequently formed over the one or more protective layers 1102 and/or the anti-reflective layer 1104. The second mask 1106 may be formed to directly overlie the plurality of openings 902 within the first dielectric layer 110. In some embodiments, the anti-reflective layer 1104 and the one or more protective layers 1102 may respectively comprise a dielectric. For example, in some embodiments the one or more protective layers 1102 may comprise silicon dioxide, silicon nitride, and/or an ONO structure, while the anti-reflective layer 1104 may comprise a nitride or a carbide. In some embodiments, the second mask 1106 may comprise a photosensitive material (e.g., photoresist), a hard mask, or the like.

Figure 12:
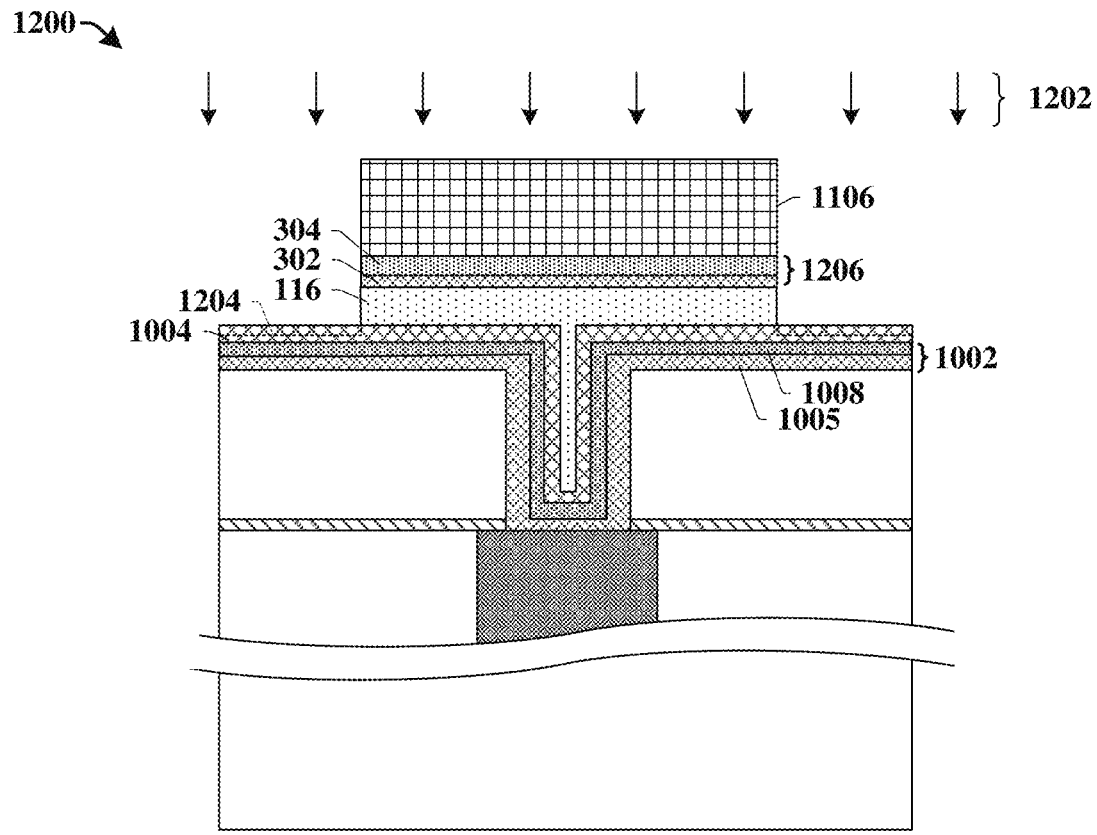

As shown in cross-sectional view 1200 of FIG. 12, a second etching process is performed according to the second mask 1106. The second etching process removes parts of the anti-reflective layer (e.g., 1104 of FIG. 11), the one or more protective layers (e.g., 1102 of FIG. 11), and the upper electrode layer (e.g., 1006 of FIG. 11) to define a lower capping structure and an upper electrode 116, and the lower capping structure includes a first protecting layer 302 and an anti-reflecting layer 304. The second etching process exposes an upper surface of the capacitor dielectric layer 1004 to a second etchant 1202 according to the second mask 1106. In some embodiments, the second etchant 1202 may comprise a dry etchant (e.g., a reactive ion etching (RIE) etchant, a plasma etchant, or the like). In some embodiments, the second etchant 1202 may have an etching chemistry comprising one or more tetrafluoromethane ($CF_4$), Fluoroform ($CHF_3$), chlorine ($Cl_2$), nitrogen ($N_2$), argon (Ar), boron trichloride ($BCl_3$), or the like. In some cases, the second etchant 1202 may also etch the capacitor dielectric layer 1004 to have a step profile (see 1204).

Figure 13:
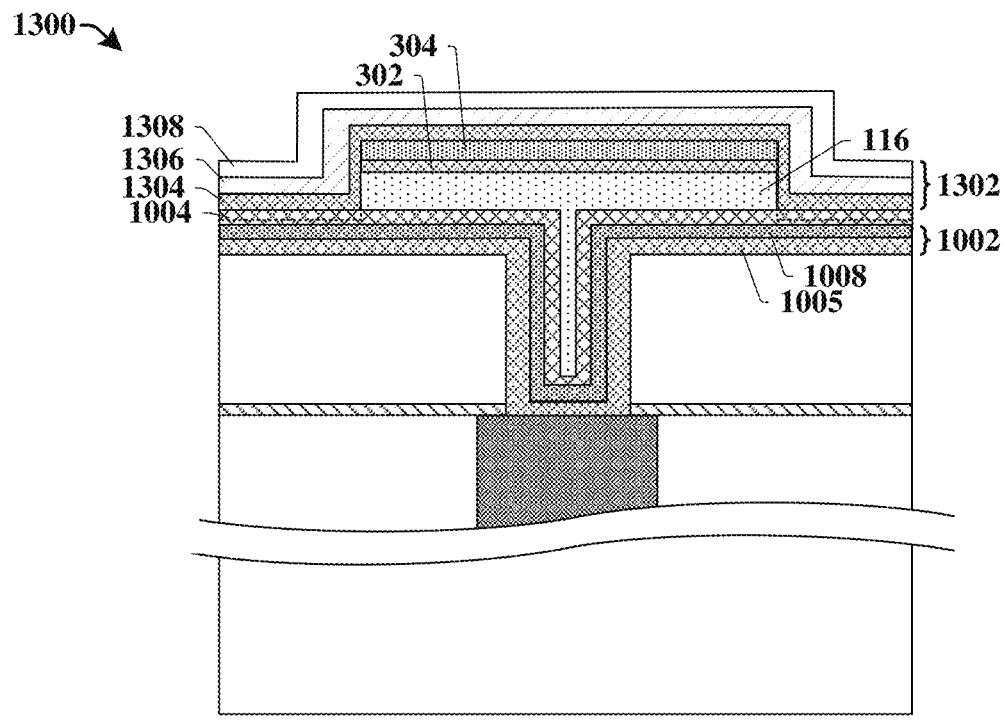

As shown in cross-sectional view 1300 of FIG. 13, an upper capping structure 1302 is formed along horizontally extending surfaces of the lower capping structure and the capacitor dielectric layer 1004 and also along sidewalls of the lower capping structure and the upper electrode 116. In some embodiments, the upper capping structure 1302 comprises a first dielectric layer 1304 and a second dielectric layer 1306 over the first dielectric layer 1304. The first dielectric layer 1304 and the second dielectric layer 1306 continuously extend between outermost sidewalls of the upper capping structure 1302. In some embodiments, the upper capping structure 1302 may be formed by one or more deposition processes (e.g., a PVD process, a CVD process, a PE-CVD process, or the like). In various embodiments, the upper capping structure 1302 may comprise silicon nitride, silicon dioxide, silicon oxynitride, and/or the like. In some embodiments, the upper capping structure 1302 is formed to a thickness that is in a range of between approximately 100 Å and approximately 1500 Å, between approximately 50 Å and approximately 1000 Å, or other similar values. In some embodiments, a third dielectric layer 1308 is optionally formed over the second dielectric layer 1306, and can ultimately be used to fashion a structure similar to FIG. 4, but the remaining FIGS. 14-19 are shown without formation of this third dielectric layer 1308.

Figure 14:
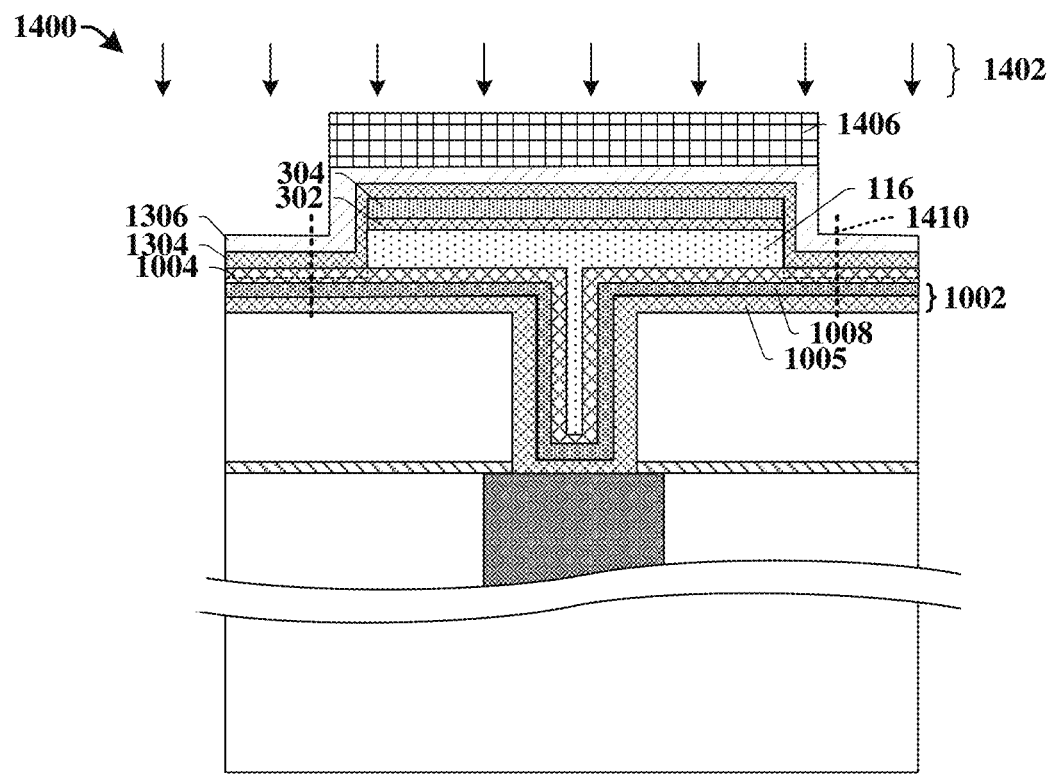
Figure 15:
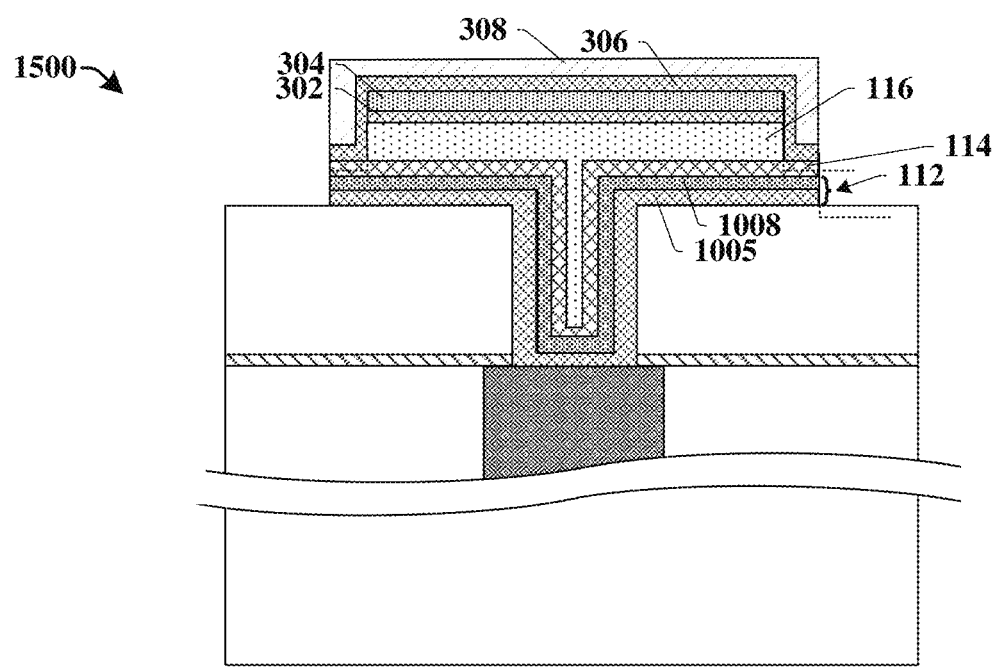

As shown in cross-sectional view 1400 of FIG. 14, a mask 1406 is formed over the upper capping structure (e.g., 1302 of FIG. 13), and portions of the upper capping structure are exposed to a third etchant 1402. The third etchant removes the lower horizontal portions of the upper capping structure (e.g., 1302 of FIG. 13). Removing the lower horizontal portions of the upper capping structure (e.g., 1302 of FIG. 13) leaves a part of the upper capping structure (e.g., 1302 of FIG. 13) along opposing sidewalls of the lower capping structure and over the upper surface of the lower capping structure, such as shown in FIG. 15. As shown in cross-sectional view 1500 of FIG. 15, parts of the lower electrode layer (e.g., 1002 of FIG. 14) and the capacitor dielectric layer (e.g., 1004 of FIG. 14) are subsequently removed according to the mask 1406 to define a lower electrode 112 and a capacitor dielectric 114 of a MIM capacitor structure 111. Since the lower electrode layer and the capacitor dielectric layer are etched according to the mask 1406, the remaining upper capping structure (including second protecting layer 306 and the first upper etch stop layer 308) has an outermost sidewall that is substantially aligned with outermost sidewalls of the lower electrode 112 and the capacitor dielectric 114. As shown by dashed lines 1410, in some embodiments, the mask 1406 can be wider, such that horizontal portions of the 1304, 1306, and/or 1004 and/or 1002 remain in place, and this could be carried through to further figures.

Figure 16:
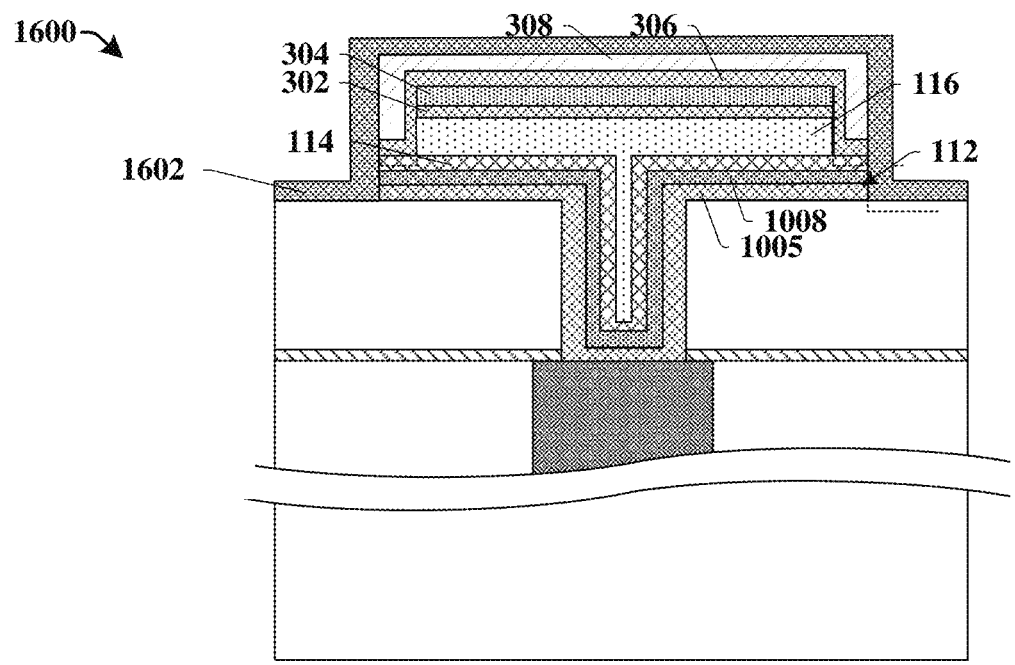

As shown in FIG. 16, a spacer layer 1602 is then formed along horizontally extending surfaces of the first upper etch stop layer 308 and first dielectric layer 110, and along sidewalls of the capacitor dielectric 114 and also along sidewalls of the lower electrode 112. In some embodiments, the spacer layer 1602 comprises a dielectric material. In some embodiments, the spacer layer 1602 may be formed by one or more deposition processes (e.g., a PVD process, a CVD process, a PE-CVD process, or the like). In various embodiments, the spacer layer 1602 may comprise silicon nitride, silicon dioxide, silicon oxynitride, and/or the like. In some embodiments, the spacer layer 1602 is formed to a thickness that is in a range of between approximately 100 Å and approximately 1500 Å, between approximately 50 Å and approximately 1000 Å, or other similar values.

Figure 17:
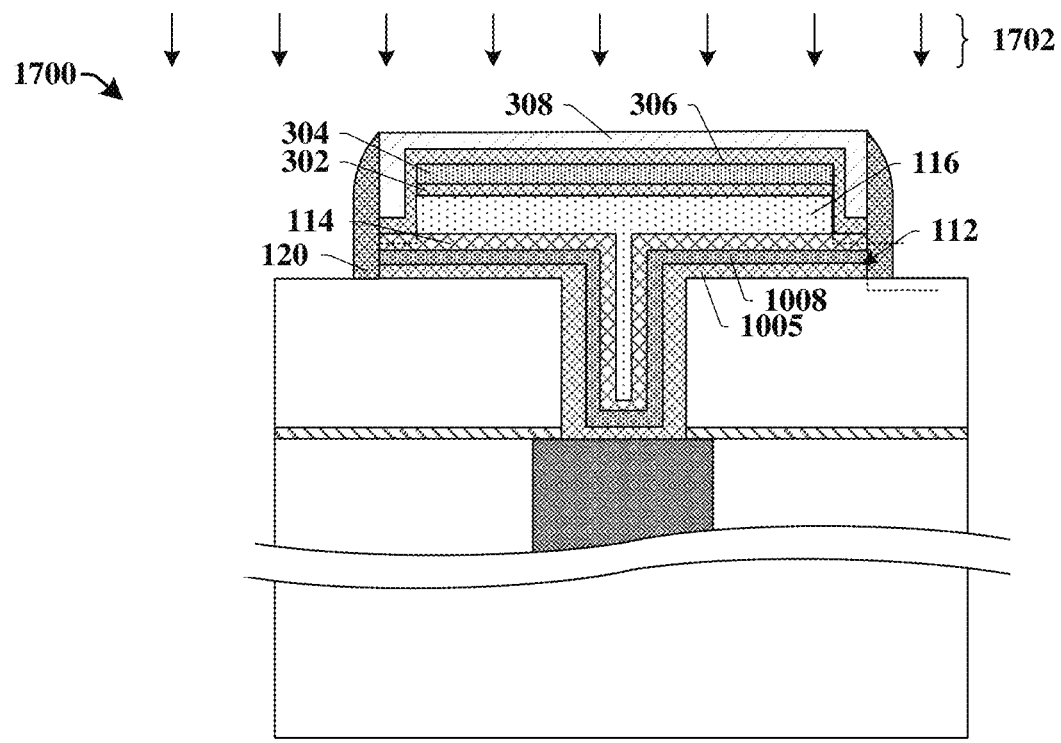

As shown in cross-sectional view 1700 of FIG. 17, the spacer layer (e.g., 1602 of FIG. 16) is exposed to a forth etchant 1702. The forth etchant removes the spacer structure 120 (e.g., 1602 of FIG. 16) from horizontal surfaces. Removing the spacer layer (e.g., 1602 of FIG. 16) from the horizontal surfaces leaves a spacer structure 120 along opposing sidewalls of the capacitor dielectric 114 and the lower electrode 112.

Figure 18:
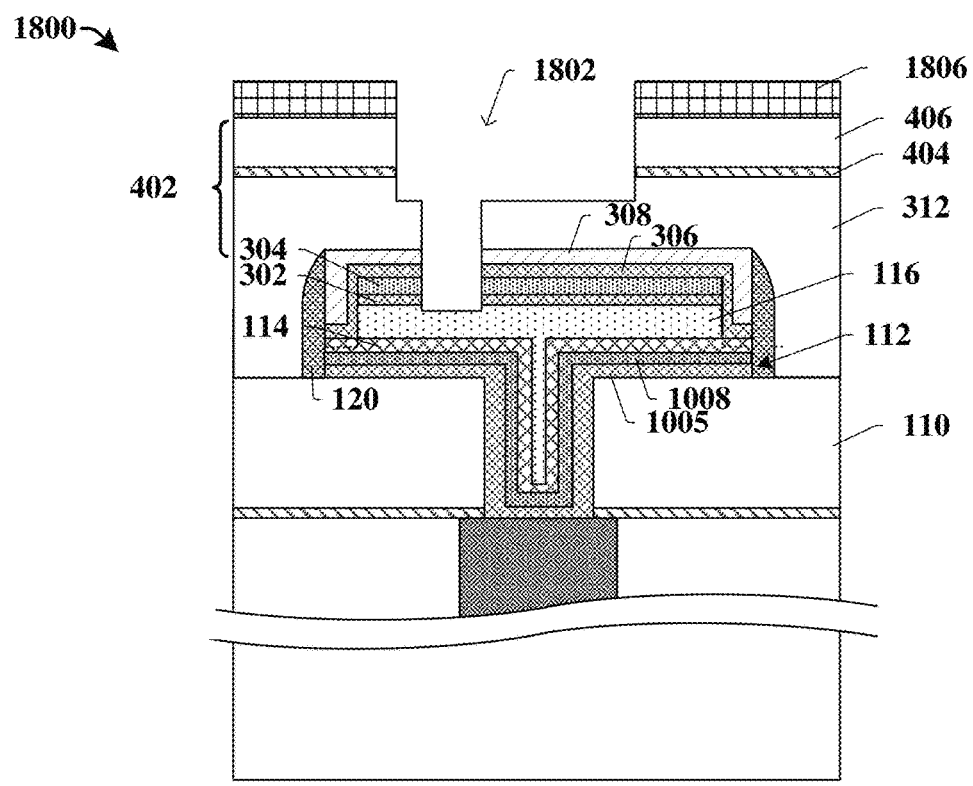

As shown in cross-sectional view 1800 of FIG. 18, a second dielectric layer 312 is formed over the MIM capacitor structure 111 and the first dielectric layer 110. In some embodiments, the second dielectric layer 312 may comprise an oxide, a low-k dielectric material, or the like. The second dielectric layer 312 may be formed by one or more deposition processes (e.g., a PVD process, a CVD process, a PE-CVD process, an ALD process, or the like). An upper dielectric structure 402 is formed over the second dielectric layer 312. In some embodiments, the upper dielectric structure 402 may be formed by forming an upper etch stop layer 404 over the second dielectric layer 312 and forming an upper ILD layer 406 over the upper etch stop layer 404. In some embodiments, the upper etch stop layer 404 may comprise a nitride (e.g., silicon nitride), a carbide (e.g., silicon carbide), or the like. In some embodiments, the upper ILD layer 406 may comprise an oxide, a low-k dielectric material, or the like. In various embodiments, the upper etch stop layer 404 and/or the upper ILD layer 406 may be formed by one or more deposition processes (e.g., a physical vapor deposition (PVD) process, a chemical vapor deposition (CVD) process, a plasma enhanced CVD (PE-CVD) process, an ALD process, or the like).

A fifth etching process is subsequently performed to form one or more upper interconnect openings 1802 within the second dielectric layer 312. The one or more upper interconnect openings 1802 extend through the upper dielectric structure 402, and the capping structure to expose an upper surface of the upper electrode 116. In some embodiments, the fifth etching process may be performed by exposing the upper dielectric structure 402 to a fifth etchant according to a third mask 1806. In some embodiments, the fifth etchant may comprise a plasma etchant having an etching chemistry comprising one or more of fluorine (F), tetrafluoromethane ($CF_4$), ozone ($O_2$), or $C_4F_8$ (Octafluorocyclobutane), or the like. In some embodiments, the third mask 1806 may comprise a photosensitive material (e.g., photoresist), a hard mask, or the like.

Figure 19:
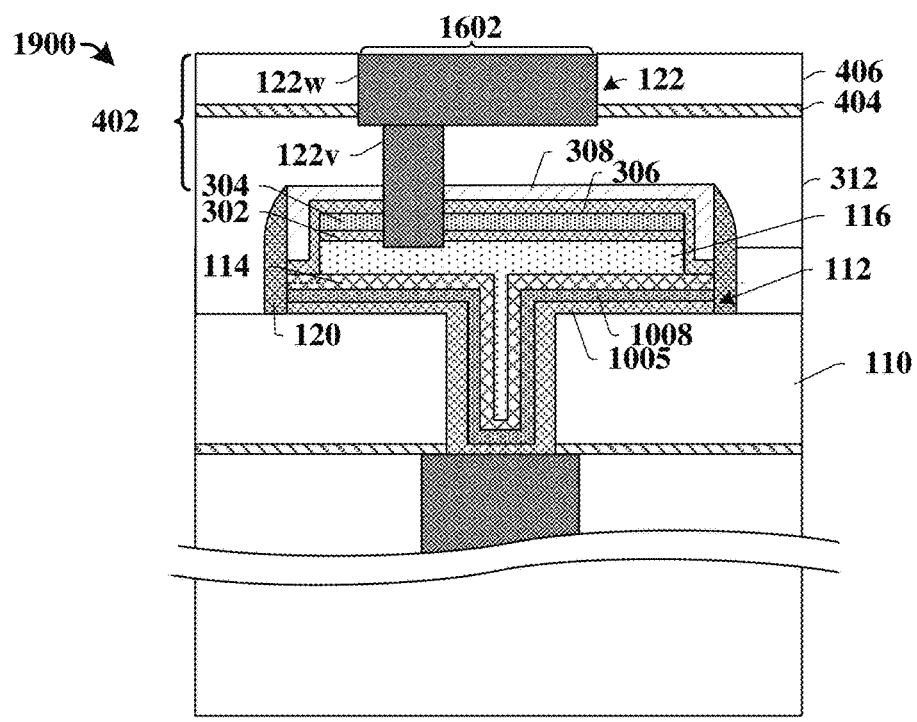

As shown in cross-sectional view 1900 of FIG. 19, a conductive material is formed within the one or more upper interconnect openings 1802. In some embodiments, the conductive material may be formed by way of a deposition process and/or a plating process (e.g., electroplating, electroless plating, etc.). In various embodiments, the conductive material may comprise copper, aluminum, or the like. After forming the conductive material within the upper interconnect opening 1802, a planarization process may be performed to remove excess of the conductive material from over the upper dielectric structure 402 and to define an upper interconnect structure 122. In some embodiments, the upper interconnect structure 122 may comprise an upper interconnect via 122v and an upper interconnect wire 122w.

Figure 20:
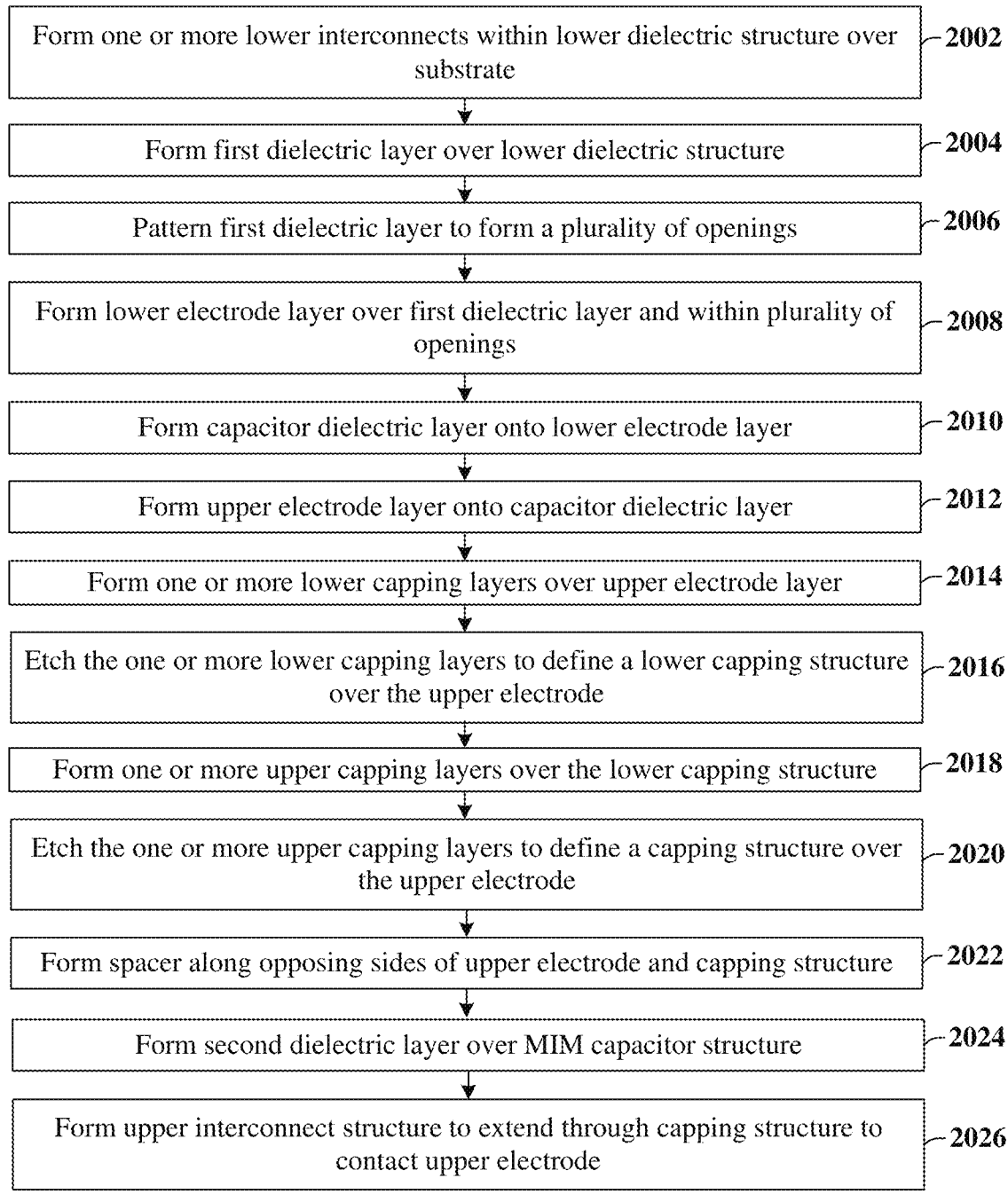
FIG. 20 illustrates a flow diagram of some embodiments of a method of forming an integrated chip having a high density MIM capacitor structure.

FIG. 20 illustrates a flow diagram of some embodiments of a method 2000 of forming an integrated chip having a high density MIM capacitor structure.

While the method 2000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, one or more lower interconnects are formed within a lower dielectric structure over a substrate. FIG. 7 illustrate cross-sectional view 700 of some embodiments corresponding to act 2002.

At 2004, a first dielectric layer is formed over the lower dielectric structure. FIG. 8 illustrates cross-sectional view 800 of some embodiments corresponding to act 2004.

At 2006, the first dielectric layer is patterned to form a plurality of openings. FIGS. 9A-9B illustrate cross-sectional views, 900 and 908, of some embodiments corresponding to act 2006.

At 2008, a lower electrode layer is formed over the first dielectric layer and within the plurality of openings. FIG. 10 illustrates a cross-sectional view 1000 of some embodiments corresponding to act 2008.

At 2010, a capacitor dielectric layer is formed onto the lower electrode layer. FIG. 10 illustrates a cross-sectional view 1000 of some embodiments corresponding to act 2010.

At 2012, an upper electrode layer is formed onto the capacitor dielectric layer. FIG. 10 illustrates a cross-sectional view 1000 of some embodiments corresponding to act 2012.

At 2014, one or more lower capping layers are formed over the upper electrode layer. FIG. 11 illustrates a cross-sectional view 1100 of some embodiments corresponding to act 2014.

At 2016, the one or more lower capping layers and the upper electrode layer are etched to define a lower capping structure and an upper electrode. FIG. 12 illustrates cross-sectional view 1200 of some embodiments corresponding to act 2016.

At 2018, one or more upper capping layers are formed over the lower capping structure. FIG. 13 illustrates a cross-sectional view 1300 of some embodiments corresponding to act 2018.

At 2020, the one or more upper capping layers are etched to define a capping structure that laterally surrounds the upper electrode. FIGS. 14-15 illustrate cross-sectional view 1400-1500 of some embodiments corresponding to act 2020.

At 2022, a spacer is formed along opposing sides of the upper electrode and the capping structure. FIGS. 16-17 illustrate cross-sectional views 1600-1700 of some embodiments corresponding to act 2022.

At 2024, a second dielectric layer is formed over the MIM capacitor structure. FIG. 18 illustrates a cross-sectional view 1800 of some embodiments corresponding to act 2024.

At 2026, an upper interconnect structure is formed to extend through the capping structure to contact the upper electrode. FIG. 19 illustrates cross-sectional views 1900 of some embodiments corresponding to act 2026.

In some embodiments, the present disclosure relates to a method of forming a capacitor structure. In this method, one or more lower interconnects is formed within a lower dielectric structure over a substrate. A first dielectric layer is formed over the lower dielectric structure. A plurality of openings are formed to extend through the first dielectric layer to expose the one or more lower interconnects. A capacitor stack is formed over the first dielectric layer and within the plurality of openings. The capacitor stack includes a capacitor dielectric layer between a lower electrode layer and an upper electrode layer. The upper electrode layer of the capacitor stack is etched to form an upper electrode. The upper electrode has an outer sidewall aligned over a location on the capacitor dielectric layer. One or more capping layers is formed to extend over the upper electrode layer and to extend along the outer sidewall of the upper electrode to contact the capacitor dielectric layer. The one or more capping layers are etched to define a capping structure over the upper electrode and to cutoff the lower electrode layer to form a lower electrode having an outer sidewall aligned with an outer sidewall of the capping structure. A spacer is formed along the outer sidewall of the capping structure and along the outer sidewall of the lower electrode. The spacer includes a lower surface that rests on an upper surface of the first dielectric layer.

In other embodiments, the present disclosure relates to a metal-insulator-metal (MIM) capacitor structure, including one or more lower interconnects disposed within a lower dielectric structure over a substrate. A first dielectric layer is disposed over the lower dielectric structure, wherein the first dielectric layer comprises inner sidewalls defining a plurality of openings extending through the first dielectric layer. A lower electrode is arranged along the inner sidewalls and over an upper surface of the first dielectric layer. A capacitor dielectric is arranged along inner sidewalls and an upper surface of the lower electrode. An upper electrode is arranged along inner sidewalls and an upper surface of the capacitor dielectric. A spacer is arranged along outermost sidewalls of the lower electrode and along outermost sidewalls of the capacitor dielectric. The spacer has an inner sidewall spaced apart from outermost sidewall of the upper electrode.

In yet other embodiments, the present disclosure relates to a method of forming a capacitor structure. In this method, a capacitor dielectric layer is formed over a lower electrode layer, and an upper electrode layer is formed over the capacitor dielectric layer. A lower capping layer is formed over horizontally extending surfaces of the upper electrode layer. The lower capping layer and the upper electrode layer is etched to define a lower capping structure that is confined over an upper electrode structure. The lower capping structure has outer sidewalls aligned with outer sidewalls of the upper electrode structure. An upper capping layer is formed over horizontally extending surfaces of the lower capping structure, along outer sidewalls of the lower capping structure, and along an upper surface of the capacitor dielectric layer. The upper capping layer, the capacitor dielectric layer, and the lower electrode layer are etched to define a capping structure, a capacitor dielectric structure, and a lower electrode structure. A spacer layer is formed over horizontally extending surfaces of the capping structure, extending along outer sidewalls of the capacitor dielectric structure, and extending along outer sidewalls of the lower electrode structure. The spacer layer is etched to remove horizontal portions of the spacer layer to define a spacer disposed along outer sidewalls of the capping structure, along outer sidewalls of the capacitor dielectric structure, and along outer sidewalls of the lower electrode structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a capacitor structure, comprising:
    forming one or more lower interconnects within a lower dielectric structure over a substrate;
    forming a first dielectric layer over the lower dielectric structure;
    forming a plurality of openings extending through the first dielectric layer to expose the one or more lower interconnects;
    forming a capacitor stack over the first dielectric layer and within the plurality of openings, the capacitor stack comprising a capacitor dielectric layer between a lower electrode layer and an upper electrode layer, with the lower electrode layer having a recessed upper surface such that the recessed upper surface of the lower electrode layer is below an uppermost surface of the first dielectric layer;
    etching the upper electrode layer of the capacitor stack to form an upper electrode, the upper electrode having an outer sidewall aligned over a location on the capacitor dielectric layer;
    forming one or more capping layers to extend over the upper electrode layer and to extend along the outer sidewall of the upper electrode to contact the capacitor dielectric layer;
    etching the one or more capping layers to define a capping structure over the upper electrode and to cutoff the lower electrode layer to form a lower electrode having an outer sidewall aligned with an outer sidewall of the capping structure; and
    forming a spacer along the outer sidewall of the capping structure and along the outer sidewall of the lower electrode, the spacer including a lower surface that rests on an upper surface of the first dielectric layer;
    wherein the spacer extends along the outer sidewall of the lower electrode, and the upper surface of the first dielectric layer steps down at an outer edge of the lower electrode to under an outer edge of the spacer.

2. The method of claim 1, further comprising:
forming a second dielectric layer on the first dielectric layer and along an outer sidewall of the spacer; and
forming one or more additional interconnects within the second dielectric layer.

3. The method of claim 1, wherein the spacer extends along the outer sidewall of the lower electrode, and the upper surface of the first dielectric layer is continuously planar from directly under an outer edge of the lower electrode to under an outer edge of the spacer.

4. The method of claim 1, further comprising:
forming an upper dielectric structure over a top surface of the capping structure; and
patterning the upper dielectric structure and the capping structure to form a via hole that exposes the upper electrode.

5. The method of claim 1, wherein the spacer continuously extends along a closed path around outermost sidewalls of the lower electrode.

6. The method of claim 1, wherein at least one of the lower electrode or the upper electrode has a thickness that is in a range of between approximately 10 Angstroms (Å) and approximately 200 Å.

7. A method of forming a capacitor structure, comprising:
forming a capacitor dielectric layer over a lower electrode layer;
forming an upper electrode layer over the capacitor dielectric layer;
forming a lower capping layer over horizontally extending surfaces of the upper electrode layer;
etching the lower capping layer and the upper electrode layer to define a lower capping structure that is confined over an upper electrode structure, wherein the lower capping structure corresponds to portions of the lower capping layer that remain after the etching of the lower capping layer and has outer sidewalls aligned with outer sidewalls of the upper electrode structure;
forming an upper capping layer over horizontally extending surfaces of the lower capping structure, along outer sidewalls of the lower capping structure, and along an upper surface of the capacitor dielectric layer;
etching the upper capping layer, the capacitor dielectric layer, and the lower electrode layer to define a capping structure, a capacitor dielectric structure, and a lower electrode structure;
forming a spacer layer over horizontally extending surfaces of the capping structure, extending along outer sidewalls of the capacitor dielectric structure, and extending along outer sidewalls of the lower electrode structure;
etching the spacer layer to remove horizontal portions of the spacer layer to define a spacer disposed along outer sidewalls of the capping structure, along the outer sidewalls of the capacitor dielectric structure, and along the outer sidewalls of the lower electrode structure while leaving the lower capping structure in place; and
forming a dielectric layer over the capping structure and over the spacer.

8. The method of claim 7, further comprising:
forming one or more lower interconnects within a lower dielectric structure over a substrate;
forming a first dielectric layer over the lower dielectric structure; and
patterning the first dielectric layer to define a plurality of openings extending through the first dielectric layer to expose the one or more lower interconnects, wherein the lower electrode layer, the upper electrode layer, and the capacitor dielectric layer are formed within the plurality of openings and over the first dielectric layer.

9. The method of claim 8, wherein the spacer has a lowermost surface disposed directly on an upper surface of the first dielectric layer.

10. The method of claim 8, wherein the plurality of openings respectively comprise a substantially rectangular shape as viewed from a top-view of the first dielectric layer.

11. The method of claim 8, wherein the plurality of openings are arranged in an array comprising a first plurality of openings arranged in a first column extending in a first direction and further comprising a second plurality of openings arranged in a first row extending in a second direction that is perpendicular to the first direction.

12. The method of claim 7, wherein the lower electrode structure has a lower electrode thickness that is in a range of between 10 Angstroms (Å) and 200 Å, and the upper electrode structure has an upper electrode thickness that is in a range of between 10 Å and 200 Å.

13. A method for forming a metal-insulator-metal (MIM) capacitor structure, comprising:
receiving a substrate;
forming one or more lower interconnects within a lower dielectric structure over the substrate;
forming a first dielectric layer over the lower dielectric structure, wherein the first dielectric layer comprises inner sidewalls defining a plurality of openings extending through the first dielectric layer;
forming a lower electrode arranged along the inner sidewalls and over an upper surface of the first dielectric layer;
forming a capacitor dielectric arranged along inner sidewalls and an upper surface of the lower electrode;
forming an upper electrode arranged along inner sidewalls and an upper surface of the capacitor dielectric;
forming a spacer arranged along outermost sidewalls of the lower electrode and along outermost sidewalls of the capacitor dielectric, wherein the spacer has an inner sidewall spaced apart from an outermost sidewall of the upper electrode and the spacer has an uppermost surface that is higher than the uppermost surface of the upper electrode; and
forming a capping structure over the upper electrode and extending down to cover the outermost sidewall of the upper electrode, the capping structure having a lower surface that resides on an upper surface of the capacitor dielectric and having an outer sidewall that contacts the inner sidewall of the spacer;
wherein the capping structure comprises:
a first protecting layer disposed directly over an upper surface of the upper electrode;
an anti-reflecting layer disposed directly over the first protecting layer; and
a second protecting layer directly over the anti-reflecting layer.

14. The method of claim 13, wherein the spacer extends along the outermost sidewalls of the lower electrode, and the upper surface of the first dielectric layer steps down at an outer edge of the lower electrode to under an outer edge of the spacer.

15. The method of claim 13, wherein the spacer extends along the outermost sidewalls of the lower electrode, and the upper surface of the first dielectric layer is continuously planar from directly under an outer edge of the lower electrode to under an outer edge of the spacer.

16. The method of claim 13, wherein the second protecting layer extends along outer sidewalls of the first protecting layer, extends along outer sidewalls of the upper electrode, and extends horizontally along an upper surface of the capacitor dielectric.

17. The method of claim 13, wherein the inner sidewall of the spacer is spaced apart from the outermost sidewall of the upper electrode by the second protecting layer.

18. The method of claim 13, further comprising:
forming a first upper etch stop layer directly over the second protecting layer, wherein the first upper etch stop layer is disposed over an upper surface of the second protecting layer and extends along outer sidewalls of the second protecting layer.

19. The method of claim 18, wherein the inner sidewall of the spacer contacts an outer sidewall of the first upper etch stop layer.

20. The method of claim 13, wherein the lower electrode or the upper electrode comprises aluminum, copper, tantalum, titanium, tantalum nitride, titanium nitride, or tungsten, the capacitor dielectric comprises a high-k dielectric material, and the lower electrode or the upper electrode has a thickness that is in a range of between 50 Angstroms (Å) and 100 Å.

* * * * *